(12) United States Patent  (10) Patent No.: US 9,316,531 B2
Suga et al.  (45) Date of Patent: Apr. 19, 2016

(54) SIGNS-OF-DETERIORATION DETECTOR FOR SEMICONDUCTOR LASER

(75) Inventors: Takako Suga, Yokohama (JP); Takeshi Uchida, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 369 days.

(21) Appl. No.: 13/597,962

(22) Filed: Aug. 29, 2012

(65) Prior Publication Data

US 2013/0056621 A1  Mar. 7, 2013

(30) Foreign Application Priority Data

Sep. 6, 2011 (JP) ................................. 2011-193549

(51) Int. Cl.
*H01S 5/00* (2006.01)
*G01J 1/42* (2006.01)

(52) U.S. Cl.
CPC ............. *G01J 1/4257* (2013.01); *H01S 5/0021* (2013.01)

(58) Field of Classification Search
CPC .................................................... H01S 5/0021
USPC ....................................... 250/205; 372/38.09
See application file for complete search history.

(56) References Cited

U.S. PATENT DOCUMENTS

| 6,141,367 | A | * | 10/2000 | Fan et al. ......................... 372/53 |
| 6,784,511 | B1 | | 8/2004 | Kunihara et al. |
| 7,222,032 | B2 | | 5/2007 | Watanabe et al. |
| 7,924,900 | B2 | | 4/2011 | Takeuchi |
| 8,111,725 | B2 | | 2/2012 | Ishii et al. |
| 2009/0173724 | A1 | * | 7/2009 | Ogino et al. ............. 219/121.75 |

FOREIGN PATENT DOCUMENTS

| JP | S61-135183 A | 6/1986 |
| JP | 03-159184 A | 7/1991 |
| JP | 07-167741 A | 7/1995 |
| JP | H07-311238 A | 11/1995 |
| JP | H07-321407 A | 12/1995 |
| JP | 2000-183446 A | 6/2000 |
| JP | 2004-254240 A | 9/2004 |
| JP | 2005-031035 A | 2/2005 |
| JP | 2006-278662 A | 10/2006 |
| JP | 2009-302513 A | 12/2009 |
| JP | 2010-040605 A | 2/2010 |

OTHER PUBLICATIONS

U.S. Appl. No. 13/720,777, filed Dec. 19, 2012. Inventor: Takeshi Uchida.

* cited by examiner

*Primary Examiner* — Renee D Chavez
(74) *Attorney, Agent, or Firm* — Fitzpatrick, Cella, Harper & Scinto

(57) ABSTRACT

A signs-of-deterioration detector for a semiconductor laser includes a first light receiving section that acquires first information relating to an optical output of the semiconductor laser and a second light receiving section that acquires second information relating to an intensity distribution of the emission pattern below the lasing threshold of the semiconductor laser. The detector also includes a holding section that holds the first information and the second information at a predetermined time point T1. The detector further includes a deciding section that decides the presence or absence of signs of rapid decrease of the optical output of the semiconductor laser by comparing the first information and the second information at at least one time point Tn (T1<Tn), with those at the time point T1.

29 Claims, 12 Drawing Sheets

SIGNS-OF-DETERIORATION DETECTOR FOR SEMICONDUCTOR LASER

BACKGROUND OF THE INVENTION

1. Field of the Invention

The present invention relates to a signs-of-deterioration detector for a semiconductor laser that detects signs of deterioration of a semiconductor laser before the semiconductor laser no longer meets the operation requirements thereof.

2. Description of the Related Art

Semiconductor laser devices have been employed in recent years in various technology sectors including those of telecommunications, recordings, sensors and electrophotographic exposures. The scope of applications of semiconductor laser devices is expected to expand in future particularly in the medical sector.

In the above-identified circumstances, there is an increasing demand for devices having a long and stable service life.

Besides, there is also a demand for systems that allow an operationally failed device to be replaced quickly and also for equipment that operates without any loss of time. Then, consequently, there is a demand for apparatus that can detect conditions of a device that can lead to an operation failure before the device actually fails to operate.

Thus, there arises a need of predicting a situation where a device can no longer meet the operation requirements thereof considerably before it actually gets into such a situation.

Japanese Patent Application Laid-Open No. 2006-278662 proposes a light source for optical communications wherein the optical output of the light source is monitored and a countermeasure is taken whenever the optical output falls below a reference value as a technique of detecting a change in a device that makes the device no longer meet the operation requirements thereof.

FIG. 9 schematically illustrates an arrangement disclosed in Japanese Patent Application Laid-Open No. 2006-278662. Referring to FIG. 9 illustrating a laser module 18 that operates as light source for optical communications, the output light from each of the surface-emitting lasers arranged on a substrate 13 in an integrated manner are transmitted through a transparent and flexible substrate 15 and made to enter the core 17 of an optical fiber 16.

The output light from each of the surface-emitting lasers (the output light leaking to the side opposite to the emission side) is constantly monitored by a corresponding photodiode 301 and, when the fall of the output of any one surface emitting laser exceeds a predetermined threshold value as determined by a control circuit 19, a switching circuit 20 is actuated so as to drive another one of the surface-emitting lasers.

However, the above-described arrangement relying only on a change in the optical output of a surface emitting laser entails a risk that no deterioration of the surface emitting laser is detected or that the surface emitting laser is determined to be deteriorated while the laser is actually not deteriorated at all, when the optical output is sensitive to the temperature of the surrounding environment and changes accordingly.

Additionally, providing a switching element in the vicinity of such a laser module in all applications may be difficult from the viewpoint of space and cost of device arrangement.

The above-identified problems will be described more specifically by referring to some of the accompanying drawings.

FIG. 4 is a graph schematically illustrating the initial characteristics of the electric current dependency of the optical output of a semiconductor laser device relative to the temperature of the surrounding environment.

According to FIG. 4, with the initial characteristics that are observed before any device deterioration, the optical output at current value A falls by about 10% when the temperature of the surrounding environment changes from 50° C. to 60° C., for example.

Therefore, if there is an arrangement that the optical output value of a device is monitored and a countermeasure, which may be replacing the device for example, is taken when the optical output value exceeds a certain reference value, the net result may be that the device is replaced although the device has not been deteriorated and is still operable to a great disadvantage from the viewpoint of cost and downsizing. On the other hand, even if the device has been deteriorated and the optical output of the device is on the way of rapidly decreasing, the optical output may increase by about 10% with the current value A when the temperature of the surrounding environment changes from 50° C. to 40° C. as seen from FIG. 4.

Note that such an actual increase of the optical output represents the temperature characteristics in a deteriorated state of the device and, if the temperature characteristics in the deteriorated state are different from the initial characteristics of the device, the optical output of the device cannot be accurately figured out from FIG. 4. In other words, the figured out optical output may only be useful as reference value.

Thus, deterioration of the device cannot be detected if the temperature characteristics of the device that is on the way of deterioration 'absorb' the deterioration. Then, replacement of the device will take place after due time and there will be a time period where no device is operable, which represents a pure loss of time.

FIG. 3 illustrates the change with time in the optical output of a semiconductor laser device observed under a condition where the device is driven with a constant electric current value and the temperature of the surrounding environment is held to a constant level.

More specifically, in FIG. 3, solid line 101 illustrates how the optical output of a semiconductor laser device changes with time under a condition where the device is driven with a constant electric current value.

According to FIG. 3, the optical output of the device is held stable for a long period of time after the device is driven to start operating but declines gradually when a certain period of time has passed. Thereafter, as time goes by further, the optical output falls dramatically.

Referring to FIG. 3, the period of time during which the optical output falls dramatically that is indicated by a dotted chain line 102 will be referred to as "optical-output-rapidly-decreasing period" in this specification.

This period is a period where the device is being rapidly deteriorated.

If the optical output of the device is required to be above value 104, which is specified as an operation requirement of the device, the device no longer meets the operation requirement after time point T2'.

If an optical output of value 103, which is higher than value 104, is defined as deterioration threshold value, deterioration of the device is detected with the known method at time point T2 when the optical output of the device falls below 103.

Since time point T2 is already in the optical-output-rapidly-decreasing period, the time span given to cope with the deterioration of the device is very short. More specifically, if the time span spent to cope with the deterioration of the device after the detection of deterioration exceeds (T2'-T2), there arises a time period when the device is no longer operable.

On the other hand, if the reference value 103 to be used for the purpose of detection of deterioration of the device is made closer to the initial stable optical output level in order to detect the deterioration of the device earlier, the difference in the optical output to be detected becomes smaller than the fluctuations in the optical output that may be caused by factors other than deterioration such as temperature changes as pointed out earlier.

Then, the operation of detecting a fall in the optical output due to deterioration early and catching signs of deterioration will become a very difficult one.

Thus, with a method that relies only on a change in the optical output, the system incorporating an semiconductor laser device is not operable and hence is not operating at all when the deteriorated device is being replaced to consequently give rise to a loss of time because the time when the deterioration of the device is detected is found in the optical-output-rapidly-decreasing period.

SUMMARY OF THE INVENTION

In view of the above-identified problems, therefore, the object of the present invention is to provide a signs-of-deterioration detector for a semiconductor laser that can detect signs of deterioration of the semiconductor laser before the optical-output-rapidly-decreasing period of the laser device comes in an operation of detecting signs of deterioration of the semiconductor laser prior to that the semiconductor laser no longer meets the operation requirements thereof.

According to the present invention, the above object is achieved by providing a signs-of-deterioration detector for a semiconductor laser including:

a first light receiving section that acquires information relating to an optical output of the semiconductor laser;

a second light receiving section that acquires information relating to an intensity distribution of the emission pattern below the lasing threshold of the semiconductor laser;

a holding section that holds the information relating to the optical output of the semiconductor laser and the information relating to the intensity distribution of the emission pattern of the semiconductor laser at a predetermined time point T1;

a deciding section that decides the presence or absence of signs of rapid decrease of the optical output of the semiconductor laser by comparing the information relating to the optical output of the semiconductor laser at at least one time point Tn, the time point Tn satisfying the requirement of T1<Tn, with the information relating to the optical output of the semiconductor laser at the time point T1 and also comparing the information relating to the intensity distribution of the emission pattern of the semiconductor laser below the lasing threshold at the time point Tn with the information relating to the intensity distribution of the emission pattern of the semiconductor laser at the time point T1; and an outputting section that outputs a signal from the deciding section.

Thus, according to the present invention, there can be realized a signs-of-deterioration detector for semiconductor laser that can detect signs of deterioration before the semiconductor laser gets into the optical-output-rapidly-decreasing period thereof in an operation of detecting signs of deterioration of the semiconductor laser before the semiconductor laser no longer meets the operation requirements thereof.

Further features of the present invention will become apparent from the following description of exemplary embodiments with reference to the attached drawings.

DESCRIPTION OF THE EMBODIMENTS

As a result of intensive research efforts, the inventors of the present invention found that a change relating to the optical-output-rapidly-decreasing period of a semiconductor laser device appear earlier in the emission pattern profile below the lasing threshold of the device than a change in the optical output.

The present invention is based on this finding. According to the present invention, there is provided a signs-of-deterioration detector for a semiconductor laser having a configuration as described below in order to detect signs of deterioration before the semiconductor laser no longer meets the operation requirements thereof. In other words, a signs-of-deterioration detector for a semiconductor laser according to the present invention is so arranged as to predict a rapid deterioration of the device before the optical-output-rapidly-decreasing period thereof on the basis of information relating to the optical output and also information relating to the intensity distribution of the emission pattern below the lasing threshold of the device while the device is still meeting the operation requirements thereof.

For the purpose of the present invention, not the far-field pattern but the near-field pattern is employed as emission pattern.

Figure 5:
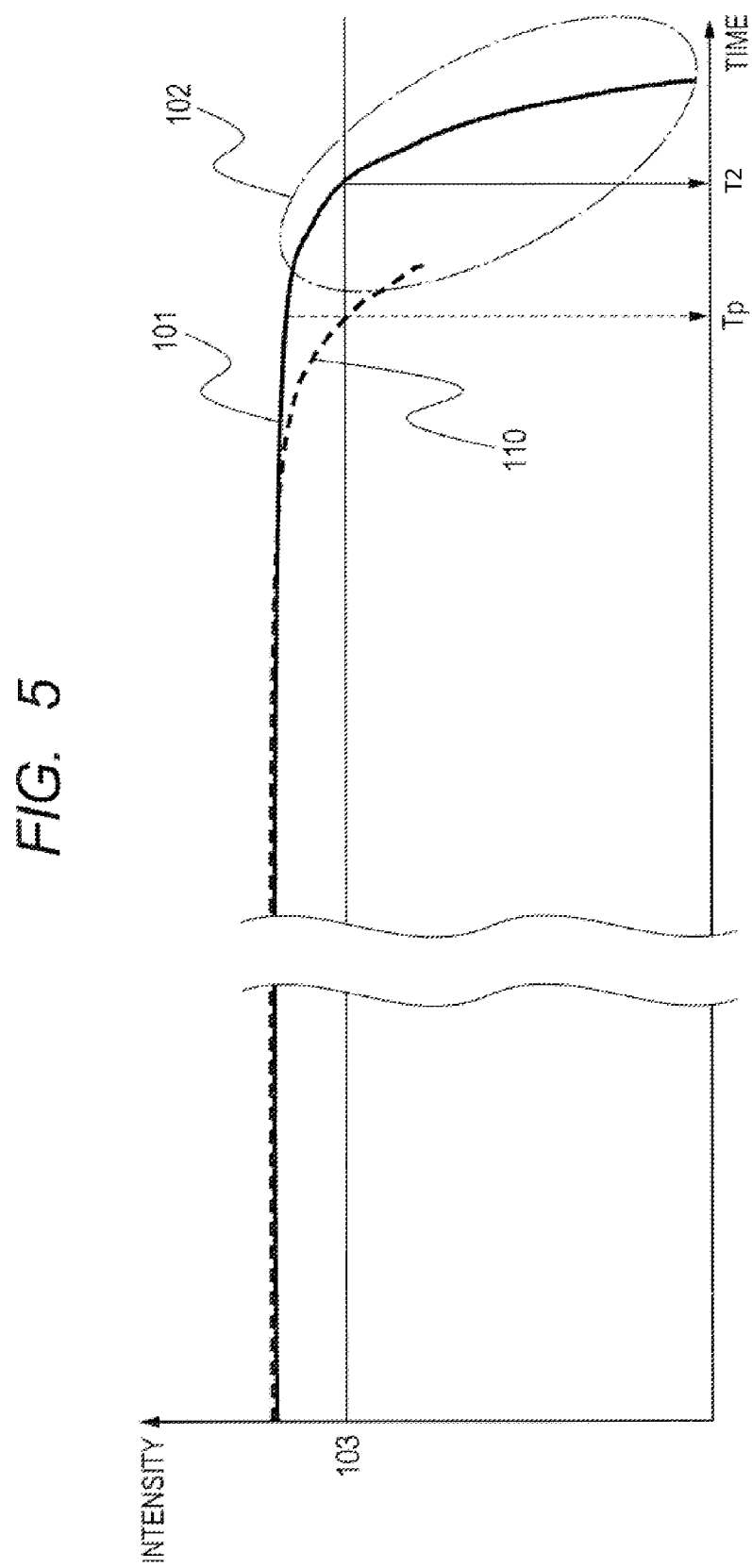
FIG. 5 is a graph schematically illustrating the difference of timings between the change in the profile of the emission pattern of a semiconductor laser device below a threshold value and the change in the optical output of the semiconductor laser device.

FIG. 5 schematically illustrates the difference of timing between the change with time of the profile of the emission pattern below the threshold value and that of the optical output.

A given ratio is employed to obtain a reference value for detecting signs of deterioration from the initial value. If the reference value is 103, the optical output falls below the reference value 103 at time point T2, whereas a profile change 110 occurs to the emission pattern to represent a fall down below the reference value 103 at time point Tp.

Then, signs of deterioration of the device can be detected earlier by the difference of time of T2-Tp.

The reason why the profile change to the emission pattern below a threshold value takes place earlier than the change in the optical output has not been known yet accurately. The inventors of the present invention propose the following theory.

If compared with a state where a semiconductor laser device is oscillating, the influence of resonance modes is not required to be taken into consideration for the emission pattern of the device below a threshold value and the state of emission in the current injection region in the active layer can be grasped more easily as intensity distribution of light.

An end portion of the current injection region is a candidate of deterioration starting point. Particularly, in the case of a current confinement type laser, the electric current is concentrated at an end portion of the current injection region and hence such an end of the current injection region can be anticipated as deterioration starting point.

A process of arranging substances having different compositions around such an end portion and producing distortion is being practiced for the purpose of current confinement. Thus, the physical properties around the current injection region are discontinuous and hence conceivably a deterioration starting point can be easily produced there.

If an end portion of the current injection region operates as deterioration starting point as described above, no remarkable influence of deterioration is observable or noticeable in an oscillating state particularly when a fundamental mode is dominant.

On the other hand, the state of an end portion of the current injection region is observable with ease in the profile of the emission pattern below the lasing threshold because the state of the entire current injection region can be grasped with ease. For this reason, conceivably signs of change may appear before the optical-output-rapidly-decreasing period.

Now, deciding process of predicting a rapid deterioration of a semiconductor laser device before the semiconductor laser gets into the optical-output-rapidly-decreasing period thereof on the basis of information relating to the intensity distribution of the emission pattern of the semiconductor laser below the lasing threshold will be described below by referring to FIG. 1. Firstly, at predetermined reference time point T1, the optical output receiving section 203 detects the optical output from the semiconductor laser 201.

Besides, the emission profile receiving section 202 detects the emission profile below the lasing threshold. The optical output may be detected before the emission profile or vice versa. However, a high efficiency can be achieved for the process by firstly observing the optical output and detecting the lasing threshold at the same time because the emission profile of the laser 201 is acquired below the lasing threshold.

The information relating to the optical output and the information relating to the emission profile acquired at time point T1 are then held in the T1 data holding section 204.

Time point T1 may be any time point at which reference data for the device can be acquired. However, a time point after the start of operation of the device and when the device has been electrically energized for some time to show a stable characteristic in the initial time period is preferable.

Information relating to the optical output can be selected from the following values.

The value of the optical output that is observed when a constant electric current is supplied to the laser 201, the value of the optical output that changes as the electric current supplied to the laser 201 is made to change, the drive current value that is observed when the drive current value is adjusted to achieve a constant optical output from the laser 201 and so on.

Figure 1:
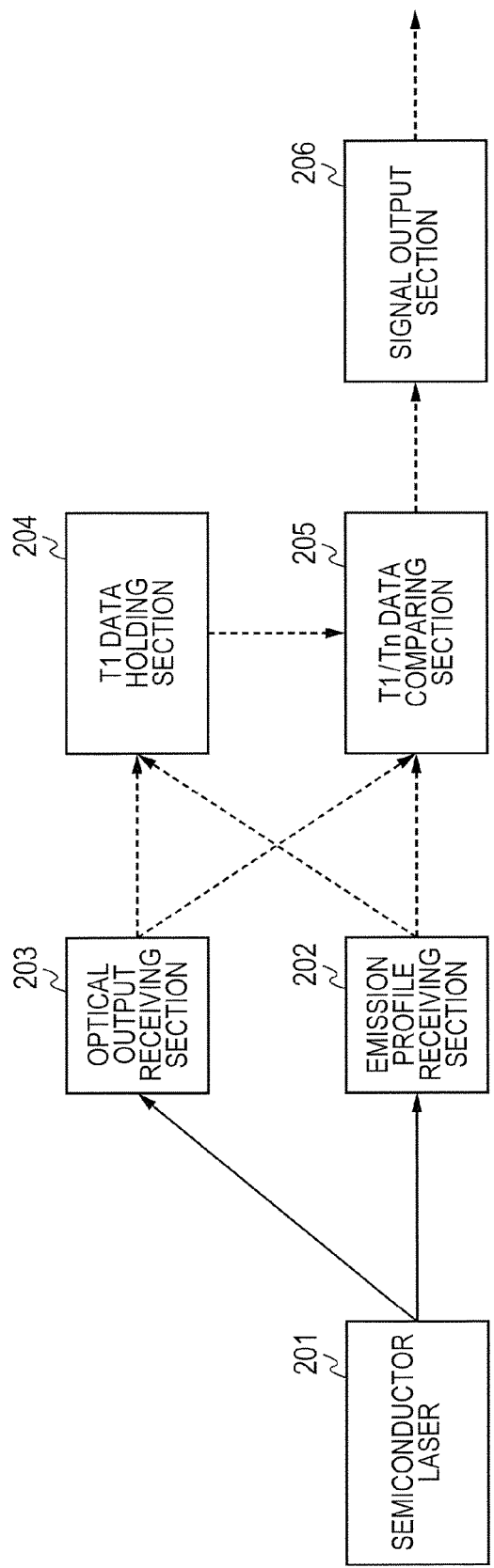
FIG. 1 is a schematic illustration of the deciding process of predicting a rapid deterioration of a semiconductor laser device before the semiconductor laser gets into the optical-output-rapidly-decreasing period thereof on the basis of information relating to the intensity distribution of the emission pattern of the semiconductor laser below the lasing threshold.

Note that, when the drive current value is selected as information relating to the optical output, a drive circuit for adjusting the power being supplied to the laser 201 according to the data from the optical output receiving section 203 is required in addition to the arrangement of FIG. 1.

The drive current value from the drive circuit is held in the T1 data holding section 204 as data relating to the optical output.

The emission profile is observed at the profile receiving section 202 in a state where an electric current below the lasing threshold is injected to the laser 201.

The profile receiving section 202 is a light receiving mechanism that can acquire the two-dimensional or one-dimensional intensity of the emission region in the laser 201. A sensor such as CCD, or CMOS or a photodetector array can be selectively employed for it.

Information relating to the emission profile may be selected from the items listed below.

Namely, the light intensity profile of the entire emission region of the laser 201, the intensity distribution of the optical output on a cross section passing through the center of the emission region of the laser 201, the half-value width of the intensity distribution of the optical output on a cross section passing through the center of the emission region of the laser 201, the value of integral of the intensity of the outside part in the emission region of the laser 201 and so on. When the intensity distribution on a cross section is selected, a direction that allows a change in the emission profile to be observed with ease should be selected accordingly.

For example, in the case of a laser using an inclined substrate, change arises from a direction that runs in parallel with the direction of inclination. Therefore, the direction of the cross section is preferably determined so as to be associated with the direction of inclination. The direction will be described in greater detail hereinafter.

Then, at time point Tn satisfying the requirement of T1<Tn, the optical output and the emission profile of the laser 201 are detected respectively by the optical output receiving section 203 and the profile receiving section 202.

Then, information relating to the optical output and information relating to the emission profile are transmitted to the T1/Tn data comparing section 205 at least once along with information at time point T1 from the T1 data holding section 204. The state of the laser 201 at time point Tn is determined by comparing these pieces of information.

The outcome of the determination is transmitted to the signal output section 206, which then outputs an appropriate signal.

Figure 6:
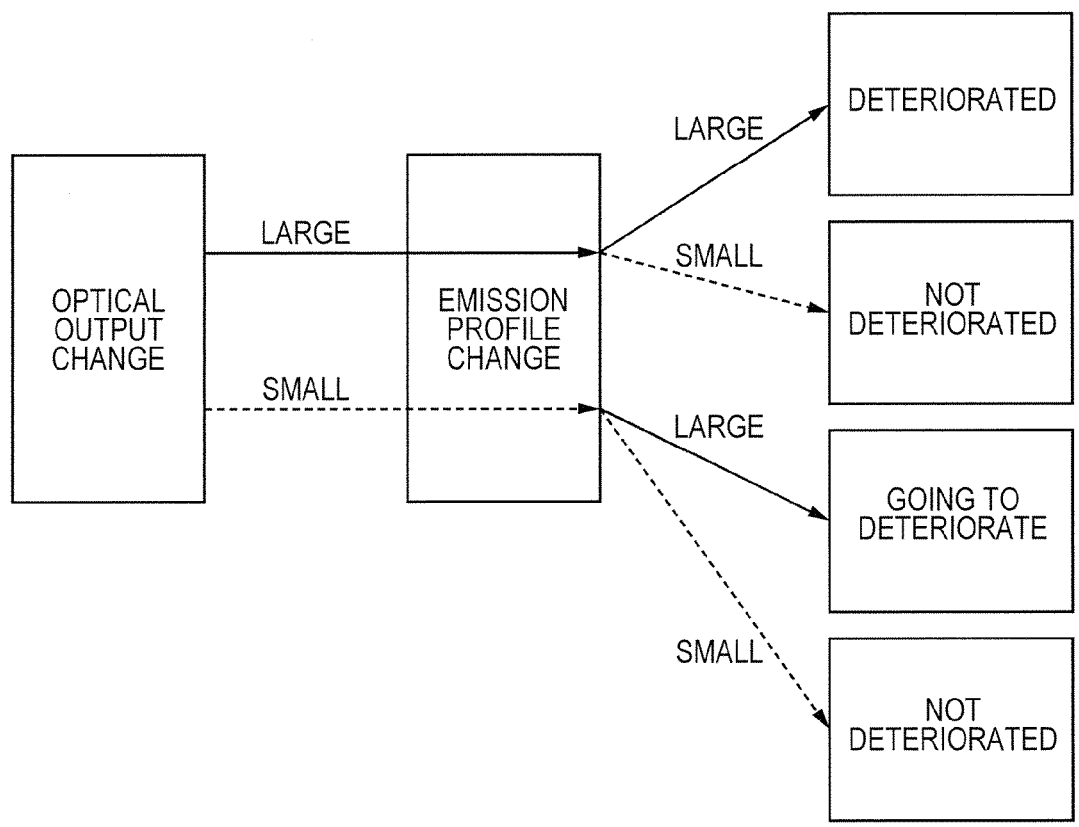
FIG. 6 is a schematic illustration of four instances of comparing information relating to the optical output and information relating to the emission profile of a semiconductor laser device for the purpose of the present invention.

The technique of comparing pieces of information will be described below by referring to FIG. 6.

Firstly, the optical output at time point T1 and the optical output at time point Tn are compared by using the acquired pieces of information. Then, change in the optical output is determined to be either large or small.

If the change is within the temperature change range in the operating environment in the initial characteristics of the device, the change is determined to be small. Otherwise, the change is determined to be large.

Figure 4:
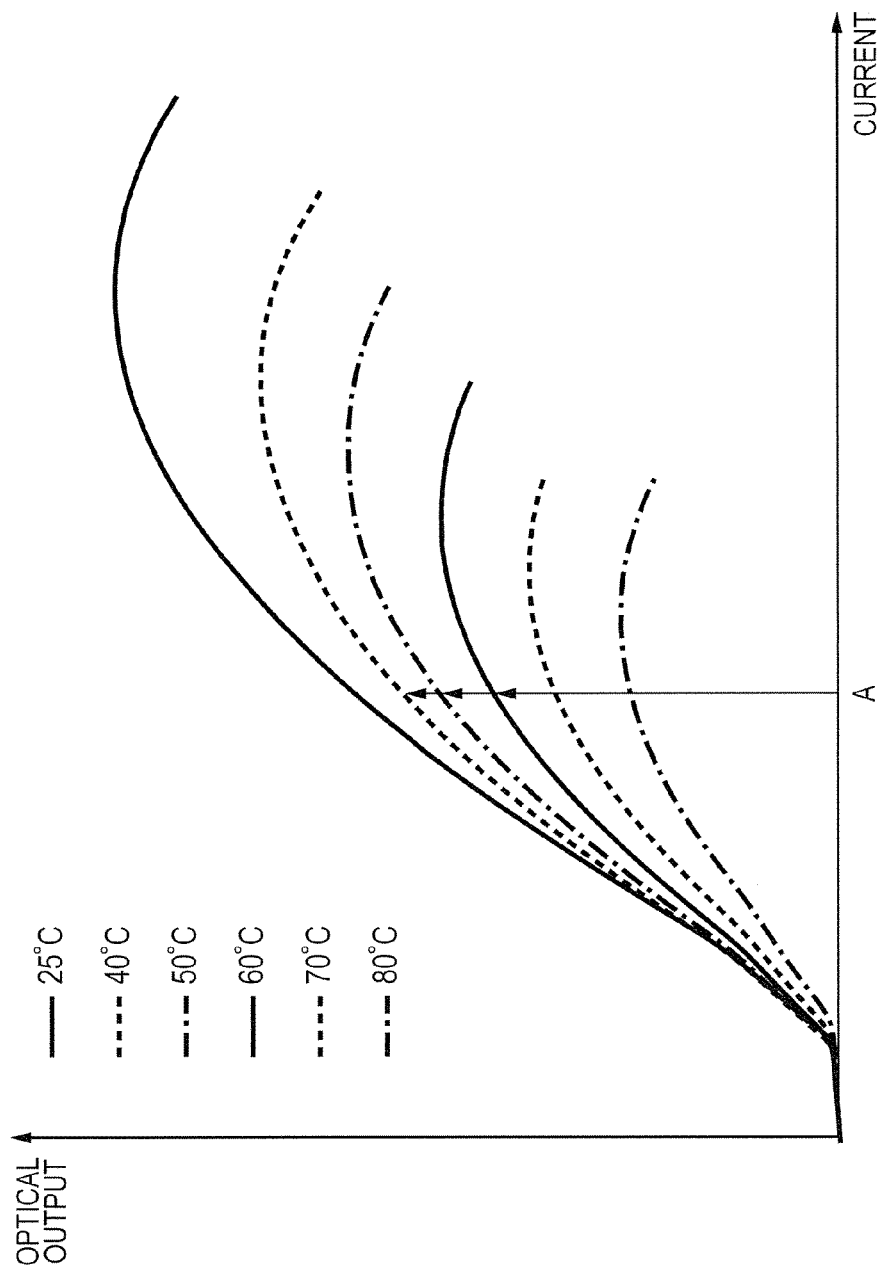
FIG. 4 is a graph schematically illustrating the initial characteristics of the electric current dependency of the optical output of a semiconductor laser device relative to the temperature of the surrounding environment, the graph being shown to illustrate the problems to be solved by the present invention.

In the case of a device representing characteristics as illustrated in FIG. 4, for instance, if the environment temperature of the device that is being operated is within the range between 50° C. and 60° C., the change in the optical output at the current value A is determined to be small when the change is not greater than 10%, whereas the change is determined to be large when the change is greater than 10%.

Thereafter, the information relating to the emission profile at time point T1 and the information relating to the emission profile at time point Tn are compared. The change in the emission profile is also determined to be large or small.

Figure 7B:
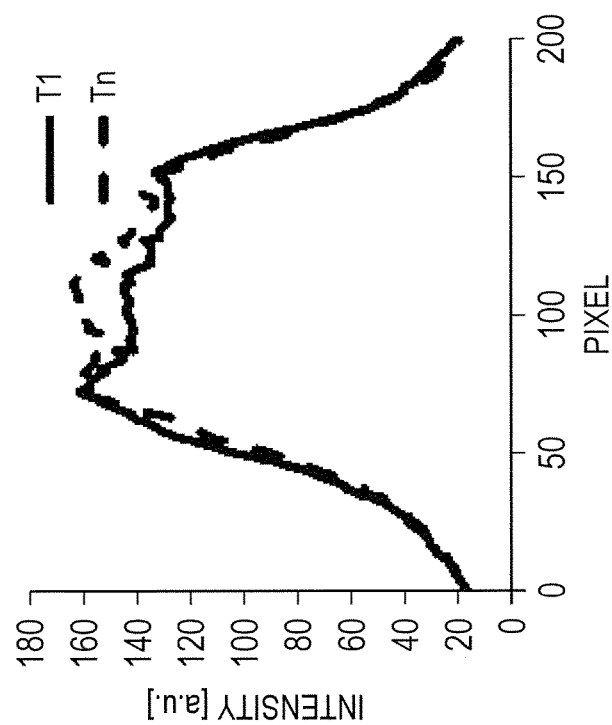
FIGS. 7A and 7B are schematic illustrations of an instance where both the optical output and the emission profile change only little.
Figure 7A:
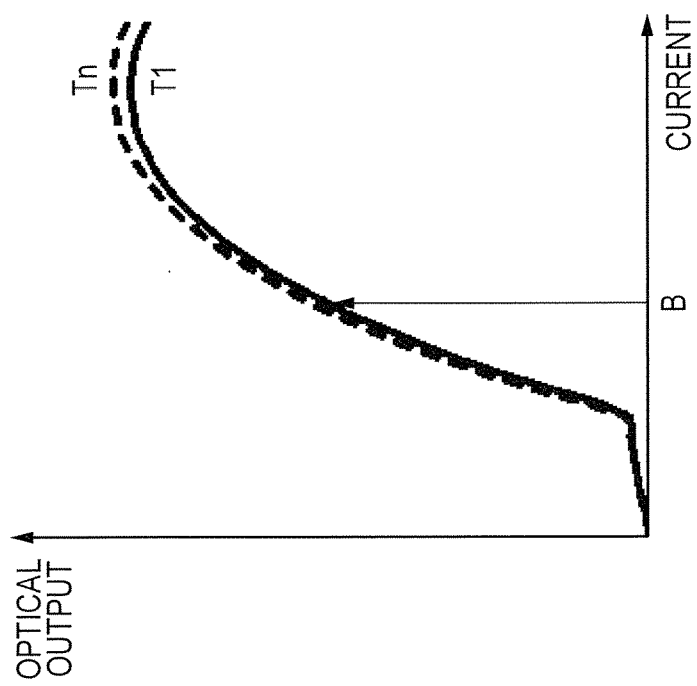

FIGS. 7A and 7B show graphs illustrating an exemplar instance where a small change is observed in the optical output and a small change is also observed in the emission profile.

FIG. 7A shows a graph illustrating the characteristics of the optical output relative to the injection current of a semiconductor laser device at time point T1 and at time point Tn.

FIG. 7B illustrates data on a cross section of the device emission profile at time point T1 and at time point Tn.

FIG. 7A tells that the optical output practically does not illustrate any change with current value B that satisfies an operation requirement.

FIG. 7B tells that the emission profile practically does not show any change either. Thus, the device is in a normal state.

Since the optical-output-rapidly-decreasing period is still further ahead, the device can be continuously operated in this state. Then, the signal output section executes a process of outputting signal "normal" or signal "no deterioration" or not outputting any signal.

Figure 8B:
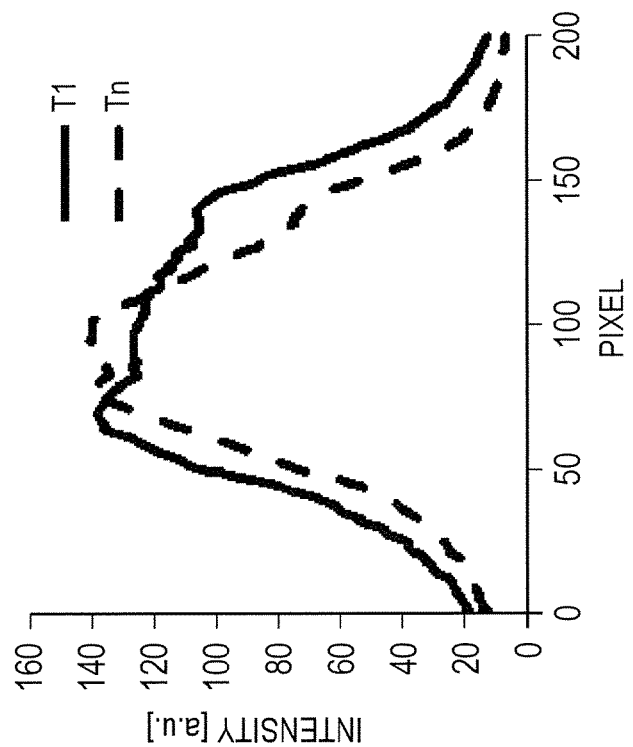
FIGS. 8A and 8B are schematic illustrations of an instance where the optical output changes only little but the emission profile changes to a large extent.
Figure 8A:
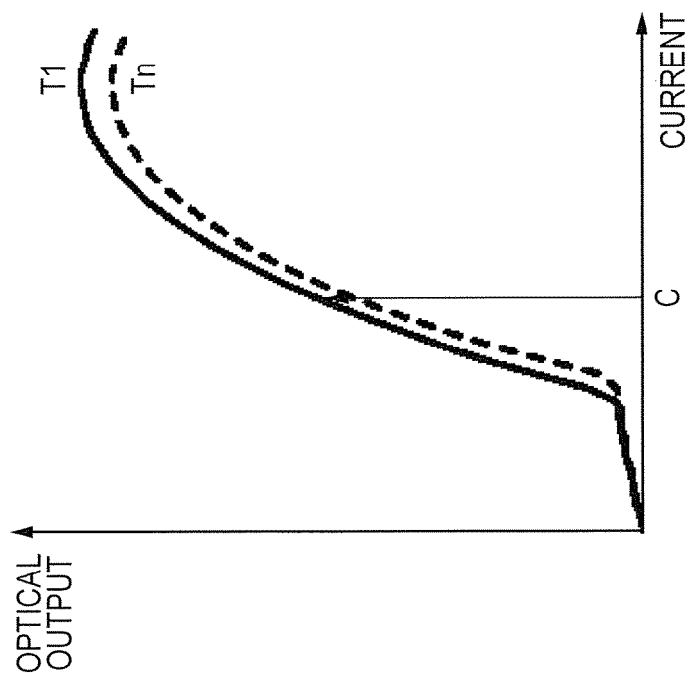
Figure 9:
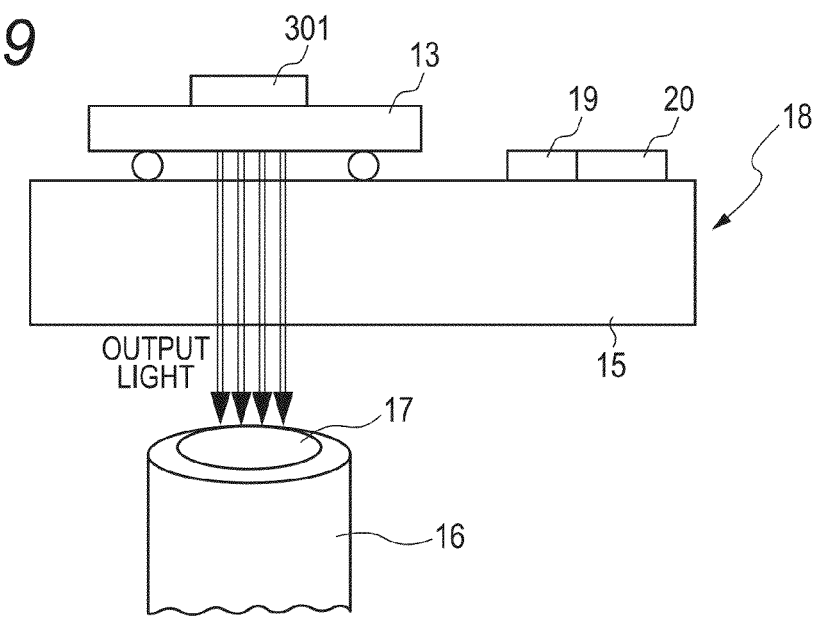
FIG. 9 is a schematic illustration of a known exemplar laser driving technique.

FIGS. 8A and 8B are similar to FIGS. 7A and 7B and show graphs illustrating an exemplar instance where only a small change is observed in the optical output but a large change is observed in the emission profile.

FIG. 8A tells that the optical output practically does not show any change with current value C that satisfies an operation requirement as in the case of FIG. 7A.

On the other hand, FIG. 8B tells that the data on a cross section of the emission profile at time point T1 significantly differ from the data on the cross section of the emission profile at time point Tn.

In this instance, the half-value width in the data on the cross section of the emission profile is decreased by 23% at time point Tn from time point T1 to tell that the optical-output-rapidly-decreasing period is near at hand. Then, the signal output section transmits an appropriate signal such as signal "deterioration is close by", "device needs replacement", or "about time of deterioration" or the like to relevant sections.

In an instance where a large change is observed in the optical output but only a small change is observed in the emission profile, the device is not still facing the optical-output-rapidly-decreasing period. Such an instance presumably occurs in a situation where the temperature of the surrounding environment has changed more remarkably than anticipated to make the optical output change to a large extent.

In such an instance, the environment of the installation of the laser device needs to be checked along with the operations of other components installed in the system including the laser device.

The operational optical output can be obtained by adjusting the value of the electric current being injected into the laser device. Then, the signal output section transmits signal "check internal environment", or "check internal temperature".

Figure 3:
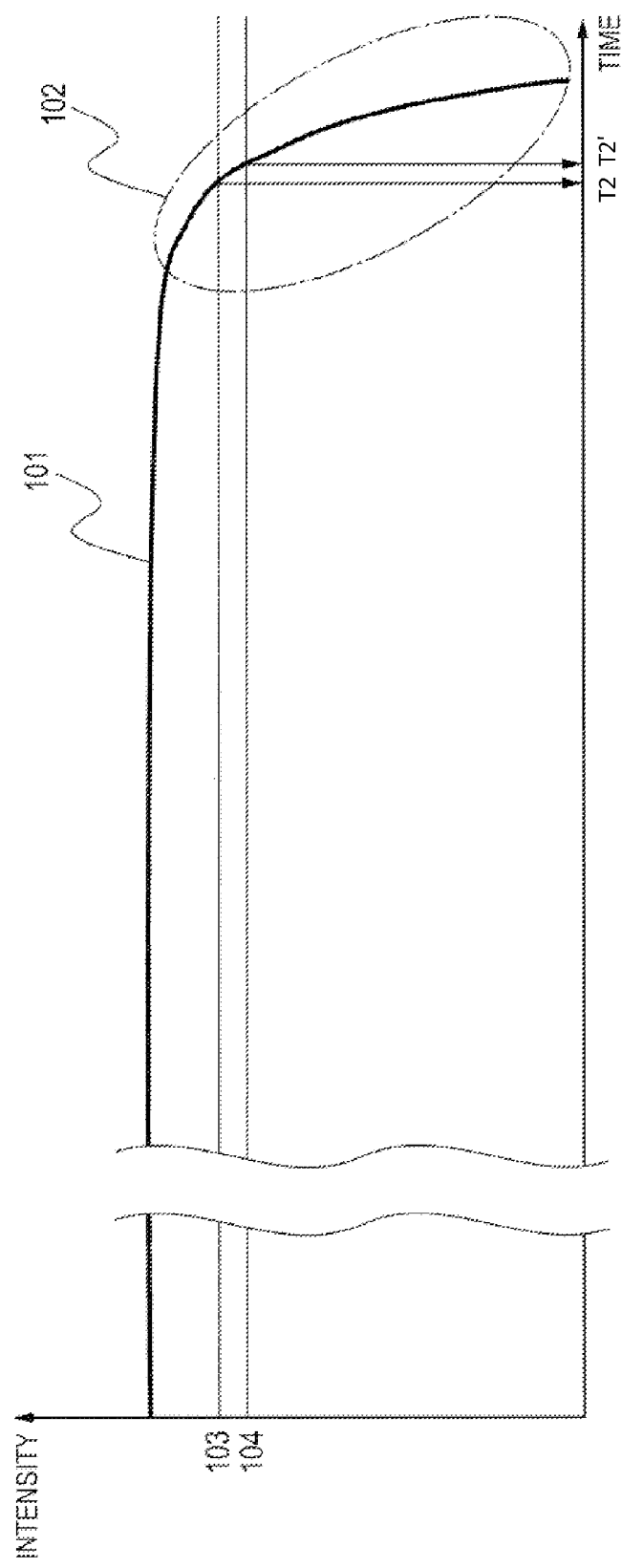
FIG. 3 is a graph illustrating the change in the optical output of a semiconductor laser device that is driven with a constant electric current value at a constant temperature of the surrounding environment, the graph being shown to illustrate the problems to be solved by the present invention.

In an instance where a large change is observed both in the optical output and also in the emission profile, the device is already in the optical-output-rapidly-decreasing period 102 shown in FIG. 3.

In such an instance, the device needs to be replaced quickly. The device cannot be operated unless it is replaced. If the deterioration of the device is not noticed, the device may be operated below its proper performance level.

Then, the signal output section outputs signal "device failure", "device deterioration", or "immediate replacement required".

Such a situation that a device is in the optical-output-rapidly-decreasing period can be avoided by reducing the time intervals of Tn.

Now, specific examples of acquisition of emission pattern profile below the lasing threshold and those of comparison technique for determining the presence or absence of signs of rapid decrease of optical output of a device will be described below.

EXAMPLE 1

An instance where the emission profile of a device is obtained after the optical output of the device is made to pass a transmission wavelength limiting filter will be described as a technique of acquiring the emission profile below the lasing threshold.

Transmission wavelength limiting filters include band pass filters that transmit only a given wavelength region, long pass filters that transmit wavelengths not lower than a given wavelength, short pass filters that transmit wavelength not higher than a given wavelength and other wavelength filters.

Figure 2:
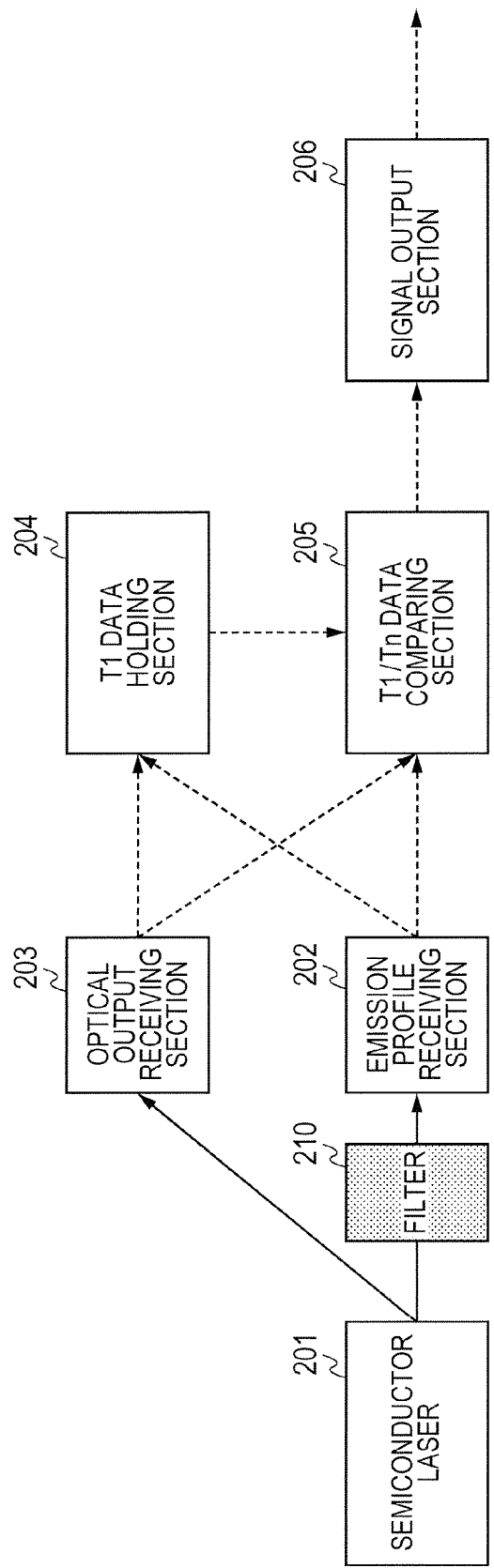
FIG. 2 is a schematic illustration of an exemplary configuration of a semiconductor laser that can be used in Example 1.

FIG. 2 is a schematic illustration of an exemplary configuration of this example.

The configuration of FIG. 2 is the same as that of FIG. 1 except that filter 210 is arranged between the semiconductor laser 201 and the profile receiving section 202.

With regard to selection of transmission wavelength for the filter 210, change in the emission profile pattern can be detected with high contrast before the optical-output-rapidly-decreasing period by using a filter of a wavelength band not including the peak emission wavelength of the active layer of the semiconductor laser device.

In the case of a device that utilizes a DBR mirror as reflector in the resonator produced by the device, a filter that transmits a wavelength region of the hems of emission intensity distribution of the active layer and also a wavelength region in which the reflectance of the DBR mirror is not more than 90% will be selected. Then, as a result, change in the performance of the device can be detected much earlier than the optical-output-rapidly-decreasing period of the device.

For example, if 668 nm is selected for the peak emission wavelength of the active layer, any of the filters listed below can be used as filter 210 having a center wavelength of 660, 650 or 640 nm.

Namely, band pass filters that transmit a wavelength region of transmission wavelength half-value width of 10 nm, various short pass filters of 660 to 600 nm, various long pass filters of not less than 700 nm and so on.

FIGS. 12A through 12H show the emission pattern images obtained through various filters in the devices that the inventors of the present invention produced immediately before the optical-output-rapidly-decreasing period.

Figure 12A:
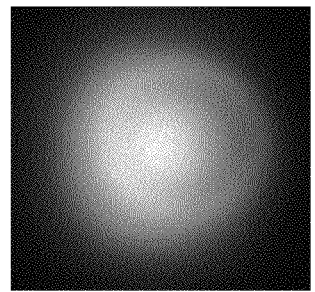
FIGS. 12A, 12B, 12C, 12D, 12E, 12F, 12G and 12H are schematic illustrations of emission patterns that can be observed through a variety of filters immediately before the optical-output-rapidly-decreasing period in Example 1.
Figure 12B:
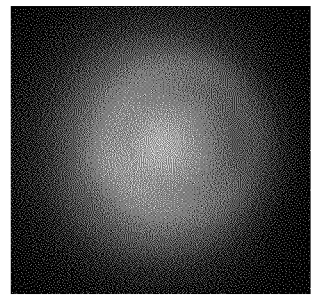
Figure 12C:
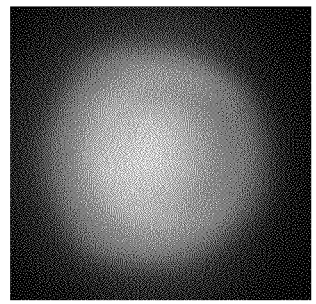
Figure 12D:
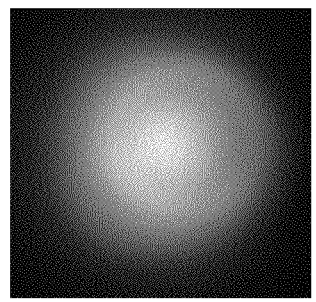
Figure 12E:
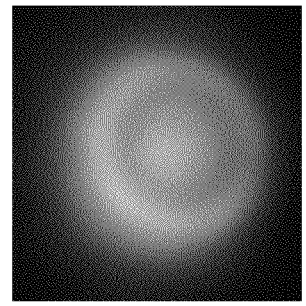
Figure 12F:
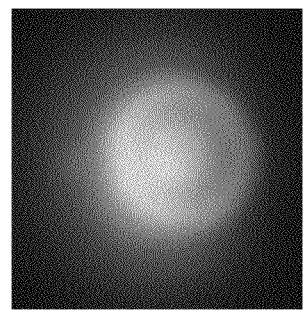
Figure 12G:
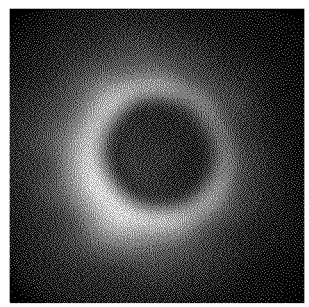
Figure 12H:
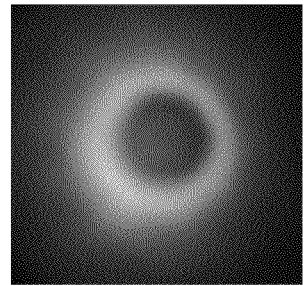

The types of filters include the following:
a 600 nm short pass filter employed for FIG. 12A;
a 640 nm band pass filter employed for FIG. 12B;
a 650 nm band pass filter employed for FIG. 12C;
a 650 nm short pass filter employed for FIG. 12D;
a 660 nm band pass filter employed for FIG. 12E;
a 700 nm long pass filter employed for FIG. 12F;
a 680 nm band pass filter employed for FIG. 12G; and
a 690 nm band pass filter employed for FIG. 12H.

The images appear differently particularly in terms of contrast between those of FIGS. 12G and 12H that are transmission images at a wavelength band where the reflectance of the DBR mirror is not less than 90% and those of FIGS. 12A through 12F that are transmission images at a wavelength band where the reflectance of the DBR mirror is not more than 90%.

The change in the performance of a semiconductor laser device can be detected earlier than the change in the optical output in the case of FIGS. 12A through 12F where the reflectance of the DBR mirror is not more than 90%.

With regard to selection of wavelength region for filter 210, a wavelength region that provides a reflectance not greater than 90% for the DBR mirror and is found closer to the emission wavelength region of the active layer is preferably selected because then an image can be acquired with a small injection current.

In the case of this example, the influence of observation on the service life of the device can be minimized by employing a 650 nm band pass filter and a 650 nm short pass filter because a profile image can be acquired with a small injection current of about 50 µA.

Information relating to the optical output of the laser 201 is acquired at the optical output receiving section 203 without the filter 210.

Then, an emission profile pattern is acquired at the profile receiving section 202 after making the emitted light transmit through the filter 210 with an injection current not greater than the lasing threshold.

The data obtained at time point T1 are stored in the T1 data holding section and compared with the data obtained at time point Tn by the T1/Tn comparing section 205.

In this example, the half-value width of the emission intensity distribution (emission intensity profile) is employed as information relating to the emission pattern profile. The half-value width of the emission pattern profile obtained at time point T1 in a situation where no significant difference is observed between the information relating to the optical output obtained at time point T1 and the corresponding information obtained at time point Tn is employed as reference. Then, when the half-value width is decreased by not less than 20% at time point Tn, the presence of signs of rapid decrease of optical output is affirmed.

In this example, the presence of signs of rapid decrease of optical output is affirmed when the half-value width of the emission pattern profile is decreased by not less than 20%, which is a specified value as described above. However, some other threshold value may be selected depending on the circumstances.

A larger value may be selected when a deteriorated device can be replaced in a shorter period of time, whereas a smaller value may be selected when a deteriorated device requires a longer period of time for replacement.

Note, however, a value not smaller than 10% is preferably selected in order to minimize the influence of errors in terms of observation environment, observation point and other factors.

Change in the emission pattern profile is expected to appear in response to a deterioration starting part of the laser 201.

When an inclined substrate is employed for the laser 201, change in the emission pattern profile appears earlier when the intensity in the direction of inclination is adopted for the half-value width of the intensity distribution of the emission pattern profile because the start of deterioration of a device shows a tendency of relating to the direction of inclination of the substrate.

An inclined substrate refers to a substrate whose surface is inclined by a certain angle in the direction specified relative to the surface orientation of the substrate.

For example, in the case of a laser 201 formed on a substrate that is inclined by 10% in the direction of <111A> relative to the GaAs(100) surface, change relating to signs of rapid decrease of optical output appears earlier and more noticeably by referring to a cross section of the emission profile.

Figure 11:
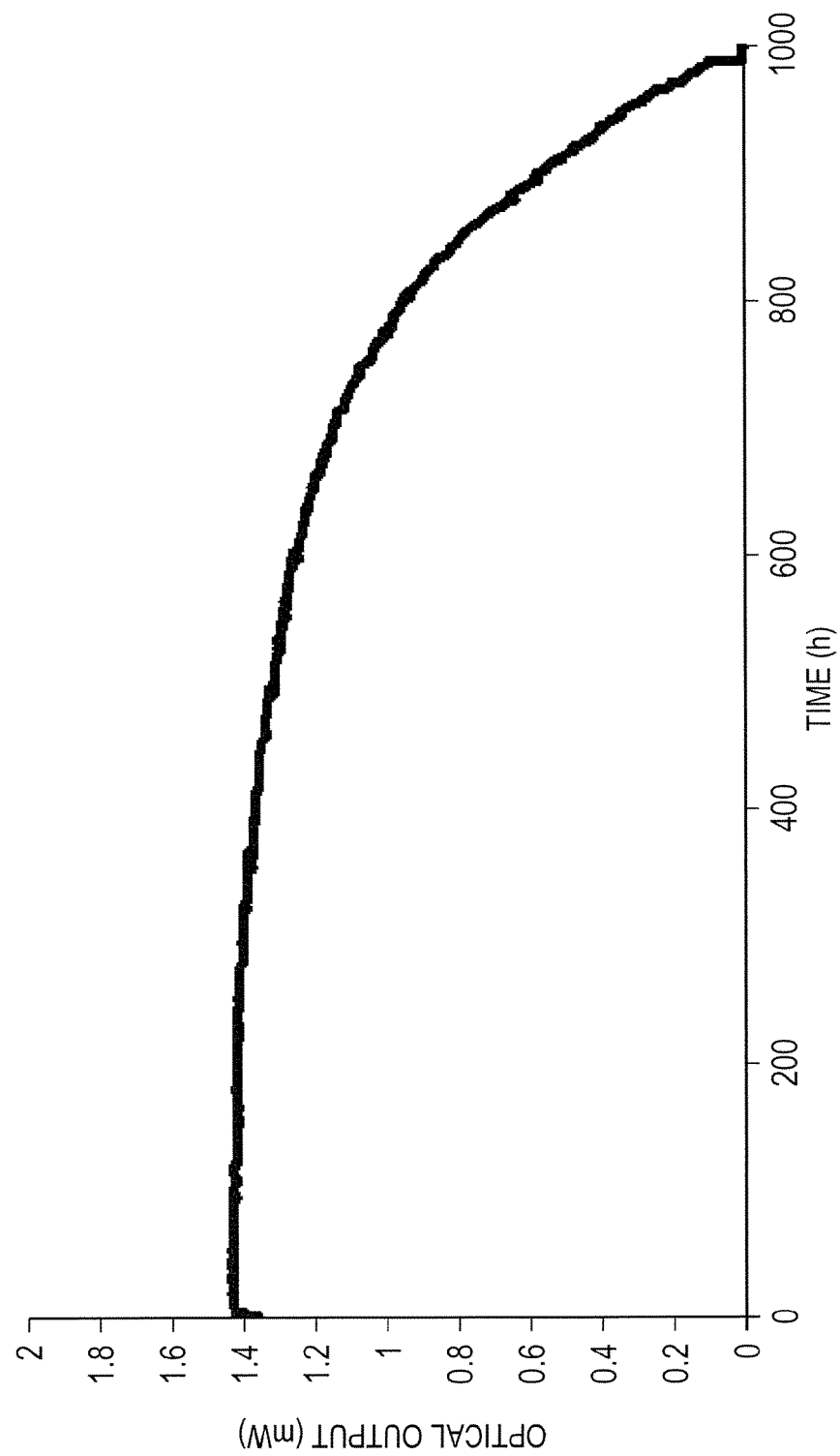
FIG. 11 is a graph showing the change with time of optical output that can be observed in Example 1.

For example, FIG. 11 shows the change with time of the optical output of a laser device prepared by the inventors of the present invention. The drive conditions employed for the observation include an environment temperature of 60° C. and a constant current drive. The drive current represents an accelerating condition of about 100 times of the actual operating condition.

If the actual operating condition of the device is 1 mW, about 100 hours pass from the time point when the change in the half-value width of the emission pattern profile gets to a 20% decrease after passing through a 650 nm short pass filter to the time point when the device no longer meets the operation requirements thereof.

This means that the operation of replacing the deteriorated device can take about 4 days. Then, when a change in the emission pattern profile is detected, the signal output section 206 transmits a signal to the device maintenance division.

Thus, as a result, an effective device replacement schedule can be drawn with an ample margin if off days of the related staff members are involved.

EXAMPLE 2

An instance where a semiconductor laser device 201 having a configuration as described above by referring to FIGS. 1 and 2 shows a reflectance distribution on the surface will be described for this example by referring to FIGS. 10A and 10B.

When a fundamental mode is desired as operation mode for a laser, a technique of giving a loss to higher modes is employed in some instances in order to limit the oscillation mode of the laser to the fundamental mode by reducing the reflectance of the part of the light-output surface where higher modes show a high intensity.

Figure 10A:
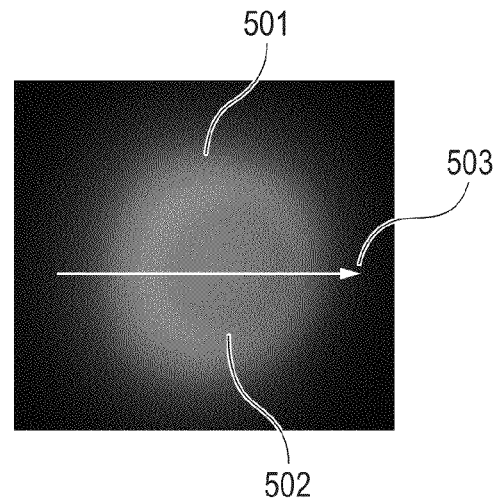
FIGS. 10A and 10B are schematic illustrations of an emission profile image and a graph of surface reflectance that can be observed in Example 2.
Figure 10B:
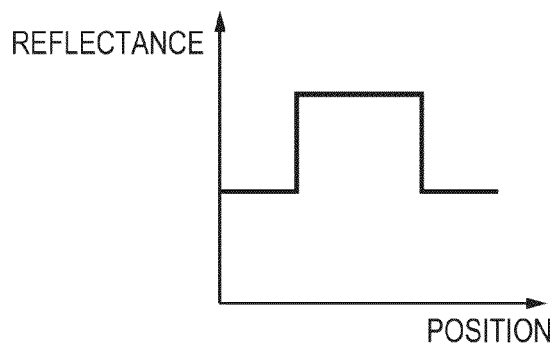

FIG. 10A shows an emission profile image of the device below the lasing threshold and FIG. 10B shows the corresponding surface reflectance.

FIG. 10A shows an emission region 501 and a reflectance border 502.

In the emission profile image of the device below the lasing threshold, the central high reflectance part, or the inside of the reflectance border 502, appears dark whereas the peripheral low reflectance part, or the inside of the emission region 501 and the outside the reflectance border 502, appears light.

As a technique of deciding the presence or absence of signs of rapid decrease of optical output of such a device, the region showing a low surface reflectance is referred to as profile data of the emission pattern.

After acquiring basic data at time point T1, optical output information and emission profile information are acquired at time point Tn. In this example, emission profile information refers to the value of integral of emission intensity in the above-described low surface reference region.

The device is operating normally and the optical-output-rapidly-decreasing period is far ahead if the optical output at time point T1 and the optical output at time point Tn do not reveal any remarkable change and the value of integral of emission intensity at time point Tn shows a decrease of less than 10% of that of emission intensity at time point T1.

On the other hand, the optical-output-rapidly-decreasing period is coming close by if the value of integral of emission intensity has decreased by a large rate.

When an inclined substrate is employed for the semiconductor laser 201, change appears earlier and more remarkably when the change in the emission profile in terms of intensity in the direction of inclination is utilized as described above for Example 1. In FIG. 10A, the direction of inclination is indicated by line 503.

The presence or absence of signs of rapid decrease of optical output of the device can be detected effectively earlier by referring to the change in the profile on a cross section passing through this line.

For instance, with regard to change in the value of integral of the emission pattern profile of the device that the inventors of the present invention produced, it takes about 100 hours from the time when the change in, or the decrease of, the value of integral is 35% to the time when the device no longer meets the operation requirements.

This means that the operation of replacing the deteriorated device can take about 4 days. Then, when a change in the emission pattern profile is detected, the signal output section 206 transmits a signal to the device maintenance division. Thus, as a result, an effective device replacement schedule can be drawn with an ample margin if off days of the related staff members are involved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-193549, filed Sep. 6, 2011, which is hereby incorporated by reference herein in its entirety.

What is claimed is:

1. A signs-of-deterioration detector for a semiconductor laser comprising:
    a first light receiving section that acquires first information relating to an optical output of the semiconductor laser at a first time point and second information relating to an optical output of the semiconductor laser at a second time point, later than the first time point;
    a second light receiving section that acquires third information relating to an intensity distribution of an emission pattern of the semiconductor laser below a lasing threshold of the semiconductor laser at a third time point which is different from the first time point and is earlier than the second time point and fourth information relating to an intensity distribution of an emission pattern of the semiconductor laser below a lasing threshold of the semiconductor laser at a fourth time point which is different from the second time point and is later than the first time point and the third time point;
    a holding section that holds the first information acquired by the first light receiving section and the third information acquired by the second light receiving section;
    a deciding section that decides presence or absence of signs of decrease of the optical output of the semiconductor laser, by comparing the first information held by the holding section with the second information acquired by the first light receiving section and also comparing the third information held by the holding section with the fourth information acquired by the second light receiving section; and
    an outputting section that outputs a signal from the deciding section.

2. The detector according to claim 1, wherein a wavelength filter that transmits only a given wavelength region is arranged between the semiconductor laser and the second light receiving section.

3. The detector according to claim 2, wherein a reflector of the semiconductor laser has a reflectance which is greater than 90% in some wavelengths, and is 90% or less in other wavelengths, and
    the wavelength filter is a filter that transmits light of the wavelengths for which the reflectance of the reflector of the semiconductor laser is not greater than 90%.

4. The detector according to claim 1, wherein the third information and the fourth information refer to a half-value width of an emission intensity profile of the semiconductor laser at the third time point and at the fourth time point respectively, and signs of decrease of the optical output refers to that the half-value width of the emission intensity profile falls short of a specified value.

5. The detector according to claim 1, wherein the semiconductor laser has a first region and a second region on a surface thereof, a surface reflectance of the second region being lower than that of a surface reflectance of the first region,
    the third information and the fourth information refer to a value of integral of an emission intensity profile of the semiconductor laser at the third time point and at the fourth time point respectively in the second region and
    the signs of decrease of the optical output refers to that the value of integral falls short of a specified value.

6. The detector according to claim 1, wherein the deciding section decides the presence of signs of decrease of the optical output of the semiconductor laser when a first change is observed between the first information and the second information, and a second change is observed between the third information and the fourth information.

7. The detector according to claim 6, wherein the expression that a second large change is observed between the third information and the fourth information refers to that a half-value width of an emission intensity profile falls short of a specified value.

8. The detector according to claim 6, wherein the semiconductor laser has a first region and a second region on a surface thereof, a surface reflectance of the second region being lower than that of a surface reflectance of the first region,
    the third information and the fourth information refer to a value of integral of the emission intensity profile at the third time point and at the fourth time point respectively in the second region, and
    the expression that a second change is observed between the third information and the fourth information refers to that the value of integral falls short of a specified value.

9. The detector according to claim 1, wherein the outputting section outputs a signal of indication for the presence of signs of decrease of the optical output of the semiconductor laser or a signal of recommendation for exchanging the semiconductor laser when a first change is not observed between the first information and the second information, and a second change is observed between the third information and the fourth information.

10. The detector according to claim 9, wherein the expression that a first change is not observed between the first information and the second information refers to that the optical output changes within a variable range of environment temperature for an operation of the semiconductor laser.

11. The detector according to claim 9, wherein the expression that a first change is not observed between the first information and the second information refers to that a change in the optical output is not greater than 10%.

12. The detector according to claim 9, wherein the expression that a second large change is observed between the third information and the fourth information refers to that a half-value width of an emission intensity profile falls short of a specified value.

13. The detector according to claim 9, wherein the semiconductor laser has a first region and a second region on a surface thereof, a surface reflectance of the second region being lower than that of a surface reflectance of the first region,
the third information and the fourth information refer to a value of integral of an emission intensity profile at the third time point and at the fourth time point respectively in the second region and the expression that a second change is observed between the third information and the fourth information refers to that the value of integral falls short of a specified value.

14. The detector according to claim 1, wherein the deciding section decides the absence of signs of decrease of the optical output of the semiconductor laser when a first change is not observed between the first information and the second information, and a second change is not observed between the third information and the fourth information.

15. The detector according to claim 14, wherein the expression that a first change is not observed between the first information and the second information refers to that the optical output changes within a variable range of environment temperature for the operation of an semiconductor laser.

16. The detector according to claim 14, wherein the expression that a first change is not observed between the first information and the second information refers to that a change in the optical output is not greater than 10%.

17. The detector according to claim 1, wherein the outputting section outputs a signal of recommendation for checking an environment of an installation of the semiconductor laser or checking a breakdown of other components installed in a system including the semiconductor laser when a first change is observed between the first information and the second information, and a second change is not observed between the third information and the fourth information.

18. The detector according to claim 1, wherein the third information and the fourth information refer to a half-value width of an emission intensity profile of the semiconductor laser at the third time point and at the fourth time point respectively.

19. The detector according to claim 1, wherein the first time point is earlier than the third time point.

20. The detector according to claim 19, wherein the lasing threshold of the semiconductor laser is detected when the first light receiving section acquires the first information and at the third time point, the second light receiving section acquires the third information on relating to the intensity distribution of the emission pattern of the semiconductor laser below the lasing threshold of the semiconductor laser, which is detected when the first light receiving section acquires the first information.

21. The detector according to claim 1, wherein the second time point is earlier than the fourth time point.

22. The detector according to claim 21, wherein the lasing threshold of the semiconductor laser is detected when the first light receiving section acquires the second information and
at the fourth time point, the second light receiving section acquires the fourth information relating to the intensity distribution of the emission pattern of the semiconductor laser below the lasing threshold of the semiconductor laser, which is detected when the first light receiving section acquires the second information.

23. A signs-of-deterioration detector for a semiconductor laser comprising:
a holding section that holds first information relating to an optical output of a semiconductor laser at a first time point and second information relating to an intensity distribution of an emission pattern of the semiconductor laser below a lasing threshold of the semiconductor laser at a second time point different from the first time point;
a first light receiving section that acquires third information relating to an optical output of the semiconductor laser at a third time point later than the first time point and the second time point;
a second light receiving section that acquires fourth information relating to an intensity distribution of an emission pattern of the semiconductor laser below a lasing threshold of the semiconductor laser at a fourth time point which is different from the third time point and is later than the first time point and the second time point;
a deciding section that decides presence or absence of signs of decrease of the optical output of the semiconductor laser, by comparing the first information held by holding section with the third information acquired by the first light receiving section and also comparing the second information held by holding section with the fourth information acquired by the second light receiving section; and
an outputting section that outputs a signal from the deciding section.

24. The detector according to claim 23, wherein the deciding section decides the presence of signs of decrease of the optical output of the semiconductor laser when a first change is observed between the first information and the third information, and a second change is observed between the second information and the fourth information.

25. The detector according to claim 23, wherein the outputting section outputs a signal of indication for the presence of signs of decrease of the optical output of the semiconductor laser or a signal of recommendation for exchanging the semiconductor laser when a first change is not observed between the first information and the third information, and a second change is observed between the second information and the fourth information.

26. The detector according to claim 23, wherein the deciding section decides the absence of signs of decrease of the optical output of the semiconductor laser when a first change is not observed between the first information and the third information, and a second change is not observed between the second information and the fourth information.

27. The detector according to claim 23, wherein the outputting section outputs a signal of recommendation for checking an environment of an installation of the semiconductor laser or checking a breakdown of other components installed in a system including the semiconductor laser when a first change is observed between the first information and the third information, and a second change is not observed between the second information and the fourth information.

28. The detector according to claim 23, wherein the first time point is earlier than the second time point.

29. The detector according to claim 23, wherein the third time point is earlier than the fourth time point.

* * * * *